United States Patent
Takahashi et al.

(10) Patent No.: US 11,467,198 B2
(45) Date of Patent: Oct. 11, 2022

(54) FREQUENCY MEASUREMENT CIRCUIT AND FREQUENCY MEASUREMENT APPARATUS

(71) Applicant: Seiko Epson Corporation, Tokyo (JP)

(72) Inventors: Tomoaki Takahashi, Minowa (JP); Hideo Haneda, Matsumoto (JP); Yasuhiro Sudo, Chino (JP)

(73) Assignee: SEIKO EPSON CORPORATION

( * ) Notice: Subject to any disclaimer, the term of this patent is extended or adjusted under 35 U.S.C. 154(b) by 231 days.

(21) Appl. No.: 17/002,823

(22) Filed: Aug. 26, 2020

(65) Prior Publication Data

US 2021/0063451 A1 Mar. 4, 2021

(30) Foreign Application Priority Data

Aug. 27, 2019 (JP) .............................. JP2019-154429

(51) Int. Cl.
*H03K 5/135* (2006.01)
*G01R 23/10* (2006.01)
*G04F 10/00* (2006.01)

(52) U.S. Cl.
CPC ........... *G01R 23/10* (2013.01); *G04F 10/005* (2013.01); *H03K 5/135* (2013.01)

(58) Field of Classification Search
None
See application file for complete search history.

(56) References Cited

U.S. PATENT DOCUMENTS

| 10,707,891 B2 * | 7/2020 | Todorokihara .......... H03M 1/54 |
| 11,070,212 B2 * | 7/2021 | Sudo ......................... H03L 1/02 |
| 2009/0102570 A1 | 4/2009 | Yoshida et al. |

FOREIGN PATENT DOCUMENTS

| JP | 2009-105651 A | 5/2009 |
| JP | 2012-154856 A | 8/2012 |

* cited by examiner

*Primary Examiner* — Cassandra F Cox
(74) *Attorney, Agent, or Firm* — Harness, Dickey & Pierce, P.L.C.

(57) ABSTRACT

A frequency measurement circuit includes a first counter that counts a pulse number of a reference clock signal and generates first count data, a second counter that counts a pulse number of a measurement target clock signal and generates second count data, a time-to-digital conversion circuit that generates first time difference data indicating a time difference between a first timing at which the first counter starts counting of the pulse number and a second timing at which the second counter starts counting of the pulse number, and second time difference data indicating a time difference between a third timing at which the first counter ends counting of the pulse number and a fourth timing at which the second counter ends counting of the pulse number, and a calculation circuit that performs calculation based on the second count data, the first time difference data, and the second time difference data and generates frequency data indicating a frequency of the measurement target clock signal.

10 Claims, 7 Drawing Sheets

FREQUENCY MEASUREMENT CIRCUIT AND FREQUENCY MEASUREMENT APPARATUS

The present application is based on, and claims priority from JP Application Serial Number 2019-154429, filed Aug. 27, 2019, the disclosure of which is hereby incorporated by reference herein in its all.

BACKGROUND

1. Technical Field

The present disclosure relates to a frequency measurement circuit and a frequency measurement apparatus.

2. Related Art

In JP-A-2012-154856, a frequency measurement apparatus is described that includes a frequency counter that measures the period of a rectangular wave signal that is input using abase clock to output the measurement value, a time width measurement portion that outputs the time information corresponding to the difference of the rectangular wave signal with respect to the base clock by using a plurality of delay elements to delay the rectangular wave signal, acquiring a value of a counter in each register at an edge of the rectangular wave signal output from each of the delay elements, and comparing the value of each register, and a calculation portion that calculates the frequency of the rectangular wave signal by calculating the count value output by a period counter and the time information output by the time width measurement portion. According to the frequency measurement apparatus described in JP-A-2012-154856, the resolution of the frequency measurement of the rectangular wave signal can be improved.

However, in the frequency measurement apparatus described in JP-A-2012-154856, since the frequency counter counts the period of the rectangular wave signal with the base clock, the gate time for frequency measurement depends on the period of the rectangular wave signal. On the other hand, since the resolution of frequency measurement depends on the delay time of the delay element, the shorter the period of the rectangular wave signal, the lower the measurement precision.

SUMMARY

A frequency measurement circuit according to an aspect of the present disclosure includes an oscillation circuit that generates a reference clock signal, a first counter that counts a pulse number of the reference clock signal and generates first count data, a second counter that counts a pulse number of a measurement target clock signal and generates second count data, a time-to-digital conversion circuit that generates first time difference data indicating a time difference between a first timing at which the first counter starts counting of the pulse number of the reference clock signal and a second timing at which the second counter starts counting of the pulse number of the measurement target clock signal, and second time difference data indicating a time difference between a third timing at which the first counter ends counting of the pulse number of the reference clock signal and a fourth timing at which the second counter ends counting of the pulse number of the measurement target clock signal, and a calculation circuit that performs calculation based on the second count data, the first time difference data, and the second time difference data and generates frequency data indicating a frequency of the measurement target clock signal.

The frequency measurement circuit according to the aspect may include a measurement start signal generation circuit that generates a measurement start signal which defines the first timing and the third timing based on the reference clock signal, and a measurement end signal generation circuit that generates a measurement end signal which defines the second timing and the fourth timing based on the measurement target clock signal, in which the time-to-digital conversion circuit may generate the first time difference data and the second time difference data based on the measurement start signal and the measurement end signal.

In the frequency measurement circuit according to the aspect, the first counter may generate the first count data so that a count number defined by a gate time signal is reached.

In the frequency measurement circuit according to the aspect, the calculation circuit may calculate Fm as $Fm=Nm/(T_0 \times Nt+t_{p2}-t_{p1})$, in which the frequency is Fm, the count number is Nt, a value of the second count data is Nm, the time difference indicated by the first time difference data is $t_{p1}$, the time difference indicated by the second time difference data is $t_{p2}$, and one period of the reference clock signal is $T_0$.

In the frequency measurement circuit according to the aspect, the first counter may generate the first count data a plurality of times, the second counter may generate the second count data a plurality of times, the time-to-digital conversion circuit may generate the first time difference data and the second time difference data a plurality of times, and the calculation circuit may generate the frequency data a plurality of times and filter the frequency data generated a plurality of times.

In the frequency measurement circuit according to the aspect, in plan view of the frequency measurement circuit, the calculation circuit may be disposed between the oscillation circuit and the time-to-digital conversion circuit.

A frequency measurement apparatus according to another aspect of the present disclosure includes the frequency measurement circuit according to the aspect, a resonator, and a package accommodating the frequency measurement circuit and the resonator, in which the oscillation circuit oscillates the resonator to generate the reference clock signal.

In the frequency measurement apparatus according to the aspect, in plan view of the frequency measurement apparatus, the resonator may not overlap the time-to-digital conversion circuit included in the frequency measurement circuit.

In the frequency measurement apparatus according to the aspect, in plan view of the frequency measurement apparatus, a distance between the resonator and the oscillation circuit may be smaller than a distance between the resonator and the time-to-digital conversion circuit.

In the frequency measurement apparatus according to the aspect, the frequency measurement circuit may be integrated into a semiconductor substrate, the semiconductor substrate may be provided with a first electrode pad and a second electrode pad that are electrically coupled to the resonator, in plan view of the frequency measurement apparatus, the semiconductor substrate may have a first side and a second side that faces the first side and that is closer to the resonator than the first side, and the first electrode pad and the second electrode pad may be disposed along the second side.

DESCRIPTION OF EXEMPLARY EMBODIMENTS

Hereinafter, preferred embodiments of the present disclosure will be described in detail with reference to the drawings. The embodiments described below do not unduly limit the content of the present disclosure described in the appended claims. Further, not all of the configurations described below are essential configuration requirements of the present disclosure.

Figure 1:
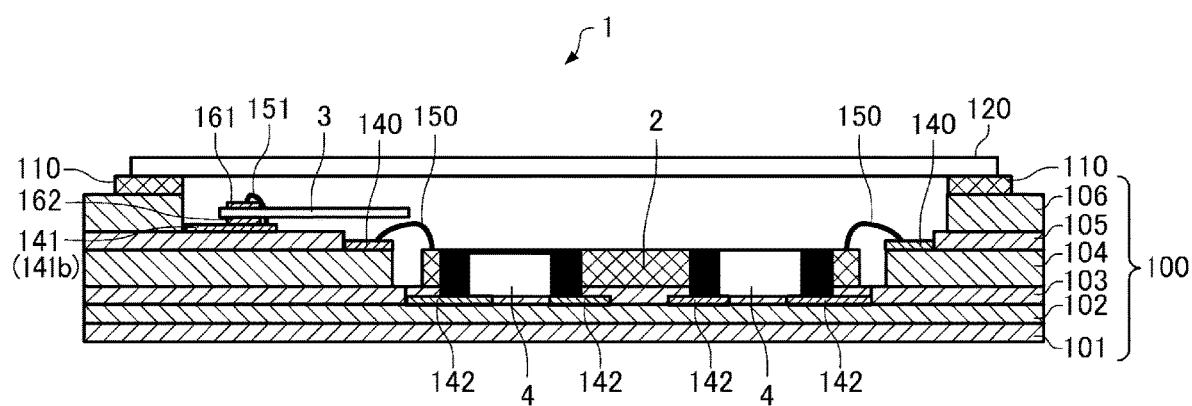
FIG. 1 is a sectional view of a frequency measurement apparatus according to a present embodiment.
Figure 2:
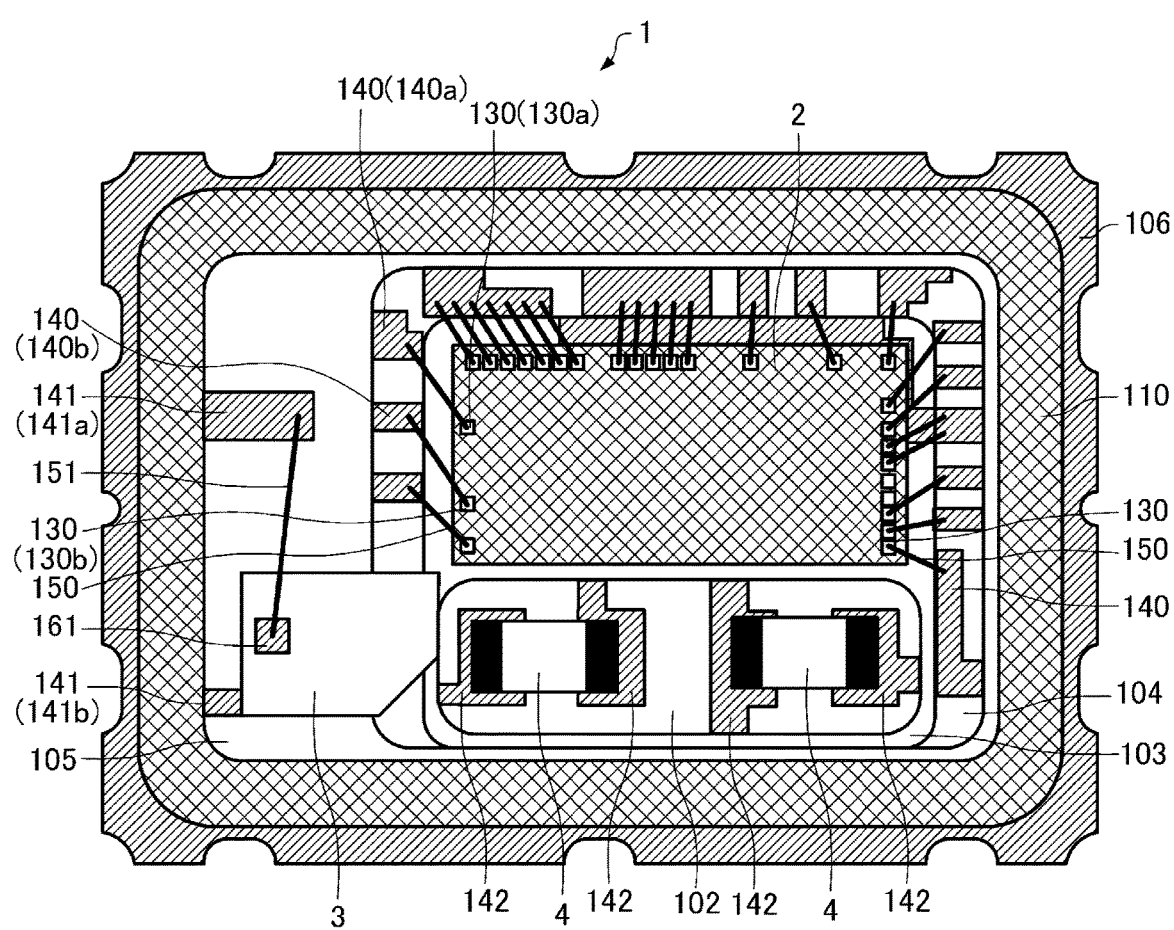
FIG. 2 is a plan view of the frequency measurement apparatus according to the present embodiment.

1. Frequency Measurement Apparatus 1-1. Configuration of Frequency Measurement Apparatus FIGS. 1 and 2 are views illustrating an example of the structure of a frequency measurement apparatus 1 of the present embodiment. FIG. 1 is a sectional view of the frequency measurement apparatus 1, and FIG. 2 is a plan view of the frequency measurement apparatus 1. FIG. 2 illustrates a state in which a lid body 120 is removed for convenience of explaining the internal configuration of the frequency measurement apparatus 1.

As illustrated in FIGS. 1 and 2, the frequency measurement apparatus 1 includes a frequency measurement circuit 2, a resonator 3, a circuit element 4, a package 100, a sealing member 110 and the lid body 120.

In the present embodiment, the resonator 3 is a quartz crystal resonator using a quartz crystal as a substrate material, such as an AT cut quartz crystal resonator or a tuning fork type quartz crystal resonator.

The package 100 accommodates the frequency measurement circuit 2, the resonator 3 and the circuit element 4 inside. The inside of the package 100 is hermetically sealed in a reduced pressure atmosphere such as vacuum or an inert gas atmosphere such as nitrogen, argon, or helium.

The package 100 is formed by stacking a first substrate 101, a second substrate 102, a third substrate 103, a fourth substrate 104, a fifth substrate 105 and a sixth substrate 106. The third substrate 103 has an opening in a portion, and the circuit element 4 is disposed on the upper surface of the second substrate 102 in a space formed by the opening of the third substrate 103.

The circuit element 4 is bonded to an electrode 142 formed at a predetermined position on the upper surface of the second substrate 102 via a bonding member (not illustrated), and is electrically coupled to the frequency measurement circuit 2 by the electrode 142 and a wiring (not illustrated) provided on the inner surface or the inside of the package 100. The circuit element 4 is, for example, a capacitor or a resistor.

The fourth substrate 104, the fifth substrate 105, and the sixth substrate 106 are annular bodies with the center portion removed, and a sealing member 110 such as a seam ring or a low-melting glass is formed at the peripheral edge of the upper surface of the sixth substrate 106. The sealing member 110 bonds the package 100 and the lid body 120.

The third substrate 103 and the fourth substrate 104 form a recess portion that accommodates the frequency measurement circuit 2. The frequency measurement circuit 2 is bonded to a predetermined position on the upper surface of the third substrate 103 by a bonding member (not illustrated), and the frequency measurement circuit 2 is electrically coupled to a plurality of electrodes 140 disposed on the upper surface of the fourth substrate 104 by a plurality of bonding wires 150.

An electrode 161 formed on the upper surface of the resonator 3 is bonded to an electrode 141a of a plurality of electrodes 141 formed on the upper surface of the fifth substrate 105 by a bonding wire 151. Further, an electrode 162 formed on the lower surface of the resonator 3 is bonded to an electrode 141b of the plurality of electrodes 141 via a bonding member (not illustrated) such as a metal bump or a conductive adhesive. Accordingly, the resonator 3 is supported by the fifth substrate 105. An excitation electrode (not illustrated) formed on the upper surface of the resonator is electrically coupled to the electrode 161, and an excitation electrode (not illustrated) formed on the lower surface of the resonator 3 is electrically coupled to the electrode 162.

A portion of a plurality of electrode pads 130 provided on the peripheral edge portion of the frequency measurement circuit 2 is electrically coupled to an external electrode (not illustrated) provided on the outer surface of the package 100 via the electrode 140 and the wiring (not illustrated) provided on the inner surface and the inside of the package 100. Further, an electrode pad 130a of the plurality of electrode pads 130 is electrically coupled to the electrode 161 via the bonding wire 150, an electrode 140a of the plurality of electrodes 140, the wiring (not illustrated) provided on the inner surface or the inside of the package 100, the electrode 141a, and the bonding wire 151. Further, an electrode pad 130b of the plurality of electrode pads 130 is electrically coupled to the electrode 162 via the bonding wire 150, an electrode 140b of the plurality of electrodes 140, the wiring (not illustrated) provided on the inner surface or the inside of the package 100, and the electrode 141b. The resonator 3 oscillates at a desired frequency according to the shape and mass of the resonator 3 including an excitation electrode by an oscillation circuit (not illustrated) electrically coupled to the electrodes 161 and 162 inside the frequency measurement circuit 2.

In FIG. 2, the resonator 3 has a rectangular shape in plan view, but the shape of the resonator 3 is not limited to a rectangular shape, and may be, for example, a circular shape. Further, the package 100 is not limited to a configuration in which the frequency measurement circuit 2 and the resonator 3 are accommodated in the same space. For example, it may be a so-called H-type package in which the frequency measurement circuit 2 is mounted on one surface of a substrate of a package and the resonator 3 is mounted on the other surface.

1-2. Configuration of Frequency Measurement Circuit

Figure 3:
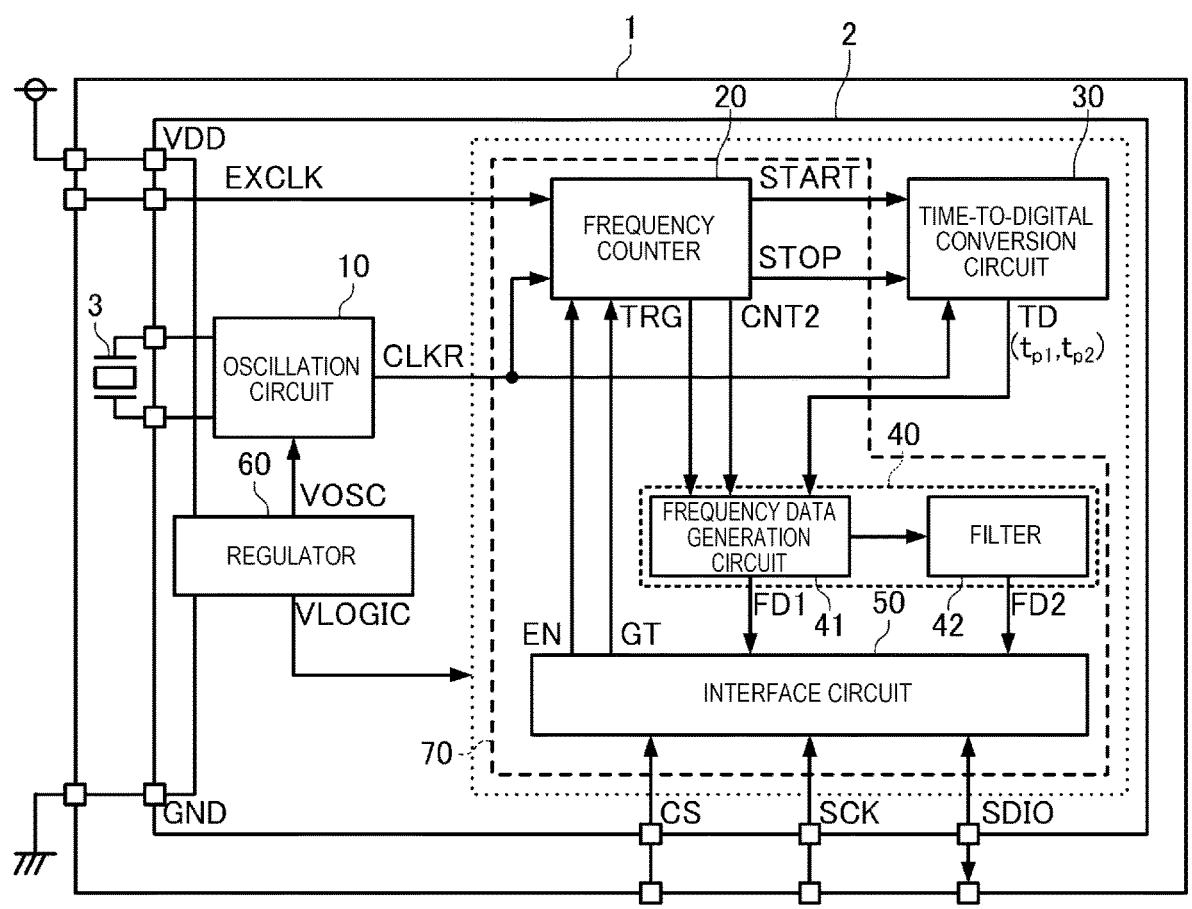
FIG. 3 is a diagram illustrating a configuration example of a frequency measurement circuit.
Figure 4:
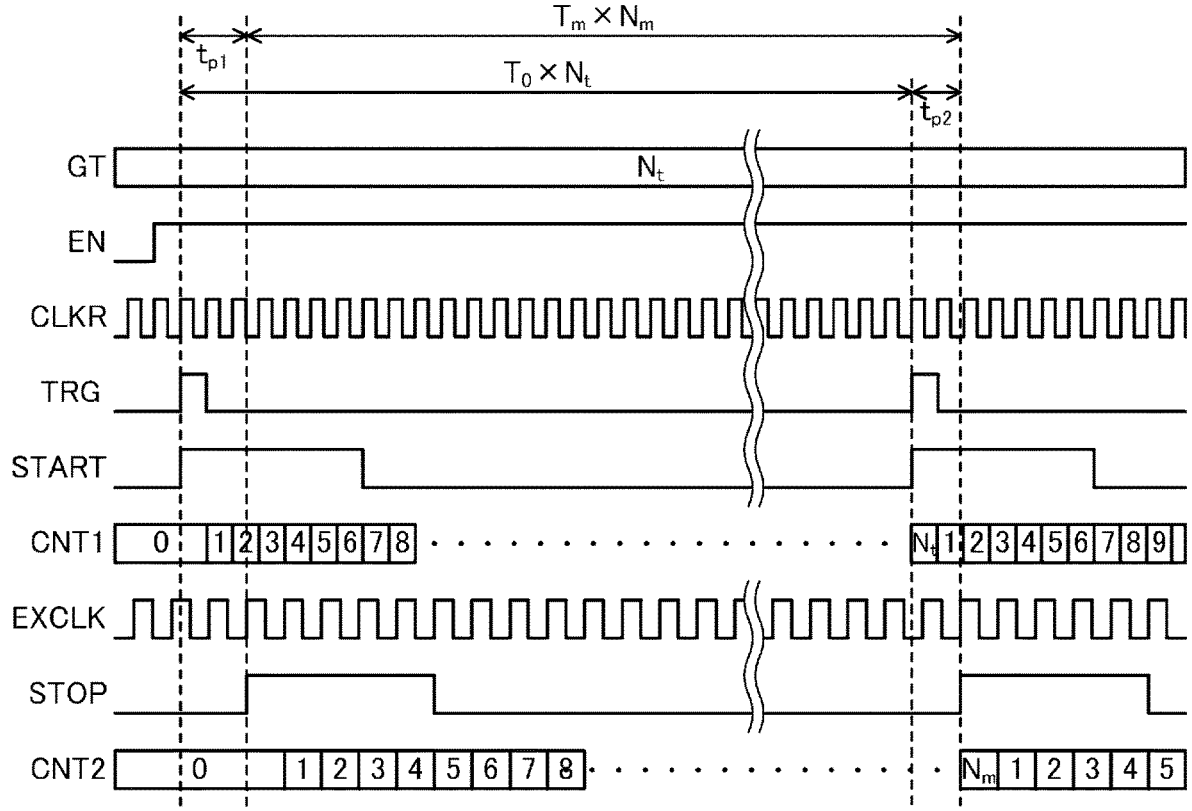
FIG. 4 is a timing chart illustrating an example of an operation timing of the frequency measurement circuit.

FIG. 3 is a diagram illustrating a configuration example of the frequency measurement circuit 2. Further, FIG. 4 is a timing chart illustrating an example of an operation timing of the frequency measurement circuit 2.

As illustrated in FIG. 3, the frequency measurement circuit 2 includes an oscillation circuit 10, a frequency counter 20, a time-to-digital conversion circuit 30, a calculation circuit 40, an interface circuit 50, and a regulator 60. The frequency measurement circuit 2 may have a configuration in which some of these elements are omitted or changed, or other elements are added. In the present embodiment, the frequency measurement circuit 2 is realized by a one-chip integrated circuit (IC: Integrated Circuit), but at least a portion of the frequency measurement circuit 2 may be constituted with a discrete component.

The regulator 60 generates a power supply voltage VOSC and a power supply voltage VLOGIC stabilized with a constant voltage value based on a power supply voltage VDD and a ground voltage GND supplied from the outside of the frequency measurement apparatus 1. The power supply voltage VOSC is supplied to the oscillation circuit 10 and becomes a power supply voltage of the oscillation circuit 10. Further, the power supply voltage VLOGIC is supplied to the frequency counter 20, the time-to-digital conversion circuit 30, the calculation circuit 40, and the interface circuit 50, and becomes a power supply voltage of each of these circuits. The ground voltage GND is a common ground voltage for the oscillation circuit 10, the frequency counter 20, the time-to-digital conversion circuit 30, the calculation circuit 40, and the interface circuit 50.

The oscillation circuit 10 is electrically coupled to the resonator 3 and oscillates the resonator 3 to generate a reference clock signal CLKR.

As illustrated in FIG. 4, when an enable signal EN changes from a low level to a high level, the frequency counter 20 generates a trigger signal TRG which is at a high level for a predetermined period and generates a measurement start signal START which is at a high level for a predetermined period. The frequency counter 20 starts the counting of the pulse number of the reference clock signal CLKR at a rising edge at which the measurement start signal START changes from a low level to a high level. When the pulse of the reference clock signal CLKR is counted $N_t$ times indicated by a gate time signal GT, the frequency counter 20 sets the trigger signal TRG to a high level for a predetermined period and sets the measurement start signal START to a high level for a predetermined period again. The frequency counter 20 initializes first count data CNT1 obtained by counting and counts the pulse number of the reference clock signal CLKR again. In FIG. 4, the first count data CNT1 is incremented from 0 to N t and initialized to 1. In this manner, the frequency counter 20 repeatedly counts the pulse number of the reference clock signal CLKR when the enable signal EN is at a high level.

Further, the frequency counter 20 generates a measurement end signal STOP in which the measurement start signal START is synchronized with a measurement target clock signal EXCLK input from the outside of the frequency measurement apparatus 1, and starts the counting of the pulse number of the measurement target clock signal EXCLK at a rising edge at which the measurement end signal STOP changes from a low level to a high level. The frequency counter 20 counts the pulse number of the measurement target clock signal EXCLK until the next rising edge of the measurement end signal STOP, and outputs a second count data CNT2. The frequency counter 20 initializes the second count data CNT2 and counts the pulse number of the measurement target clock signal EXCLK again. In FIG. 4, the second count data CNT2 is incremented from 0 to $N_m$ and initialized to 1. In this manner, the frequency counter 20 repeatedly counts the pulse number of the measurement target clock signal EXCLK when the enable signal EN is at a high level.

The time-to-digital conversion circuit 30 generates a time-to-digital value TD according to a time difference between a rising edge of the measurement start signal START and a rising edge of the measurement end signal STOP, based on the reference clock signal CLKR.

The rising edge of the measurement start signal START is a first timing at which the frequency counter 20 starts the counting of the pulse number of the reference clock signal CLKR, and the rising edge of the measurement end signal STOP is a second timing at which the frequency counter 20 starts the counting of the pulse number of the measurement target clock signal EXCLK. Accordingly, the time-to-digital conversion circuit 30 generates the time-to-digital value TD as first time difference data corresponding to a time difference between the first timing and the second timing. In FIG. 4, a time difference between the first timing and the second timing is $t_{p1}$, and the time-to-digital conversion circuit 30 generates the time-to-digital value TD as the first time difference data corresponding to the time difference to.

Further, the next rising edge of the measurement start signal START is a third timing at which the frequency counter 20 ends the counting of the pulse number of the reference clock signal CLKR, and the next rising edge of the measurement end signal STOP is a fourth timing at which the frequency counter 20 ends the counting of the pulse number of the measurement target clock signal EXCLK. Accordingly, the time-to-digital conversion circuit 30 generates the time-to-digital value TD as a second time difference data corresponding to a time difference between the third timing and the fourth timing. In FIG. 4, a time difference between the third timing and the fourth timing is $t_{p2}$, and the time-to-digital conversion circuit 30 generates the time-to-digital value TD as the second time difference data corresponding to the time difference $t_{p2}$.

In this manner, the time-to-digital conversion circuit 30 generates the first time difference data and the second time difference data based on the measurement start signal START and the measurement end signal STOP.

The third timing is also the first timing at which the frequency counter 20 next starts the counting of the pulse number of the reference clock signal CLKR. Ina similar manner, the fourth timing is also the second timing at which the frequency counter 20 next starts the counting of the pulse number of the measurement target clock signal EXCLK.

The calculation circuit 40 is synchronized with the trigger signal TRG to perform calculation based on the second count data CNT2, the time-to-digital value TD as the first time difference data, and the time-to-digital value TD as the second time difference data, and generates frequency data indicating a frequency of the measurement target clock signal EXCLK. In the present embodiment, the calculation circuit 40 includes a frequency data generation circuit 41 and a filter 42.

The frequency data generation circuit 41 generates frequency data FD1 indicating a frequency $F_m$ of the measurement target clock signal EXCLK at the rising edge at which the trigger signal TRG changes from a low level to a high level, based on the second count data CNT2, the time-to-digital value TD as the first time difference data corresponding to the time difference $t_{p1}$, and the time-to-digital value TD as the second time difference data corresponding to the time difference $t_{p2}$. Specifically, when one period of the reference clock signal CLKR is $T_0$, one period of the measurement target clock signal EXCLK is $T_m$, a value of the second count data CNT2 is $N_m$, and a count number defined by the gate time signal GT is $N_t$, the frequency data generation circuit 41 calculates the frequency $F_m$ of the measurement target clock signal EXCLK by the following Equation 1.

$$F_m = \frac{1}{T_m} = \frac{N_m}{(T_0 \times N_t) + t_{p2} - t_{p1}} \quad (1)$$

Figure 5:
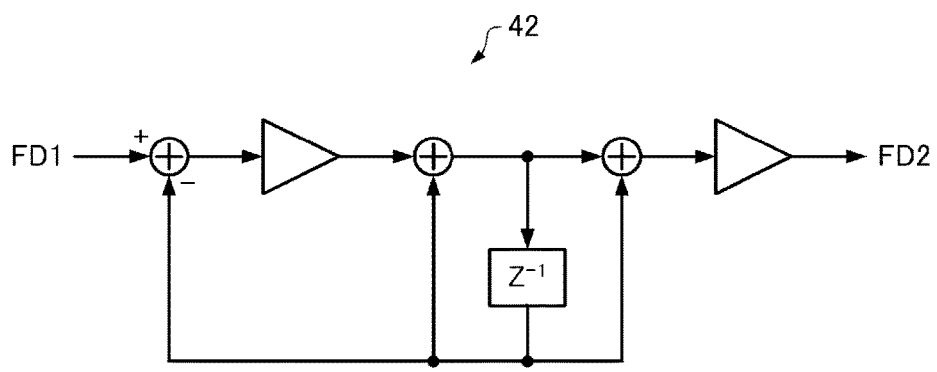
FIG. 5 is a diagram illustrating a configuration example of a filter.
Figure 6:
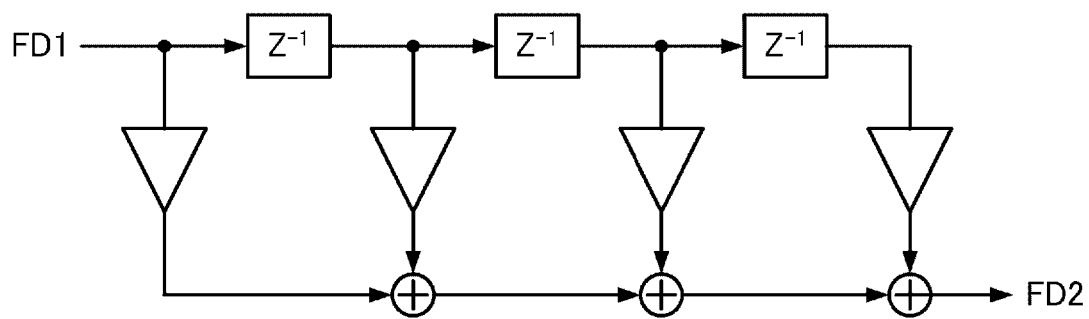
FIG. 6 is a diagram illustrating another configuration example of a filter.

The filter 42 performs digital filter processing on a plurality of frequency data FD1 sequentially generated by the frequency data generation circuit 41, and generates frequency data FD2 in which noise superimposed on each frequency data FD1 is reduced. For example, the filter 42 may be an infinite impulse response (IIR) filter as illustrated in FIG. 5 or may be a finite impulse response (FIR) filter as illustrated in FIG. 6.

The interface circuit 50 is a circuit for performing data communication between the frequency measurement apparatus 1 and a coupled external apparatus (not illustrated). In the present embodiment, the interface circuit 50 is an interface circuit compatible with a 3-wire serial peripheral interface (SPI) bus using a chip select signal CS, a serial clock signal SCK, and a serial input/output data signal SDIO.

When the interface circuit 50 receives a command instructing the measurement of the frequency of the measurement target clock signal EXCLK from the external apparatus, the interface circuit 50 sets the enable signal EN to a high level to operate the frequency counter 20. Further, the interface circuit 50 receives a command designating the gate time of the frequency measurement of the measurement target clock signal EXCLK from the external apparatus, and sets the value of the gate time signal GT to the designated gate time. That is, in the present embodiment, the gate time for the frequency measurement is variable and is set optionally.

Further, when the interface circuit 50 receives a command instructing the transmission of the frequency measurement result of the measurement target clock signal EXCLK from the external apparatus, the interface circuit 50 transmits the frequency data FD1 or the frequency data FD2 to the external apparatus according to the instruction of the command.

The frequency counter 20, the calculation circuit 40 and the interface circuit 50 constitute a logic circuit 70.

1-3. Configuration of Frequency Counter

Figure 7:
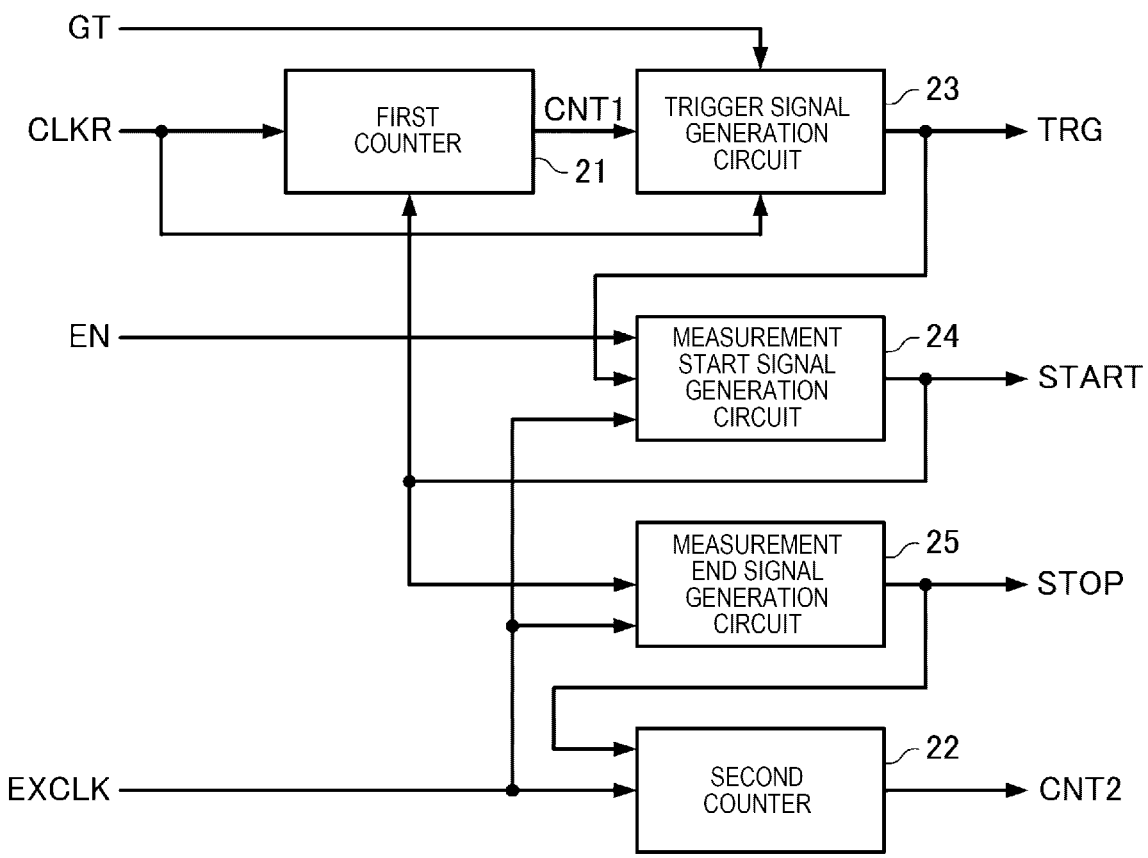
FIG. 7 is a diagram illustrating a configuration example of a frequency counter.

FIG. 7 is a diagram illustrating a configuration example of the frequency counter 20. As illustrated in FIG. 7, the frequency counter 20 includes a first counter 21, a second counter 22, a trigger signal generation circuit 23, a measurement start signal generation circuit 24, and a measurement end signal generation circuit 25.

The first counter 21 counts the pulse number of the reference clock signal CLKR and generates the first count data CNT1. Specifically, the first counter 21 ends the counting of the pulse number of the previous reference clock signal CLKR at each rising edge of the measurement start signal START to initialize the first count data CNT1, and starts the counting of the pulse number of the reference clock signal CLKR. The first counter 21 generates the first count data CNT1 indicating the count value of the pulse number of the reference clock signal CLKR.

The trigger signal generation circuit 23 generates the trigger signal TRG based on the first count data CNT1. Specifically, the trigger signal generation circuit 23 generates the trigger signal TRG that is at the high level for one period of the reference clock signal CLKR at a timing at which the first count data CNT1 matches the gate time signal GT.

The measurement start signal generation circuit 24 generates the measurement start signal START that defines a first timing at which the first counter 21 starts the counting of the reference clock signal CLKR and a third timing at which the first counter 21 ends the counting of the reference clock signal CLKR, based on the reference clock signal CLKR. Specifically, the measurement start signal generation circuit 24 changes the measurement start signal START from the low level to the high level when the enable signal EN changes from the low level to the high level. Further, when the enable signal EN changes from the low level to the high level, the measurement start signal generation circuit 24 changes the measurement start signal START from the low level to the high level in synchronization with the reference clock signal CLKR. Further, the measurement start signal generation circuit 24 changes the measurement start signal START from the low level to the high level at a timing at which the trigger signal TRG changes from the low level to the high level, and changes the measurement start signal START from the high level to the low level when the pulse of the reference clock signal CLKR is counted a predetermined number of times. An optional timing at which the measurement start signal START changes from the low level to the high level is the first timing, and after the first timing, a timing at which the measurement start signal START changes from the low level to the high level is the third timing.

The measurement end signal generation circuit 25, based on the measurement target clock signal EXCLK, generates the measurement end signal STOP that defines a second timing at which the second counter 22 starts the counting of the pulse number of the measurement target clock signal EXCLK and a fourth timing at which the second counter 22 ends the counting of the pulse number of the measurement target clock signal EXCLK. Specifically, the measurement end signal generation circuit 25 generates the measurement end signal STOP in which the measurement start signal START synchronized with the reference clock signal CLKR is synchronized with the measurement target clock signal EXCLK. Accordingly, when the measurement start signal START changes from the low level to the high level in synchronization with the reference clock signal CLKR, the measurement end signal STOP changes from the low level to the high level in synchronization with the measurement target clock signal EXCLK. Further, when the measurement start signal START changes from the high level to the low level in synchronization with the reference clock signal CLKR, the measurement end signal STOP changes from the high level to the low level in synchronization with the measurement target clock signal EXCLK. An optional timing at which the measurement end signal STOP changes from the low level to the high level is the second timing, and after the second timing, a timing at which the measurement end signal STOP changes from the low level to the high level is the fourth timing.

Figure 8:
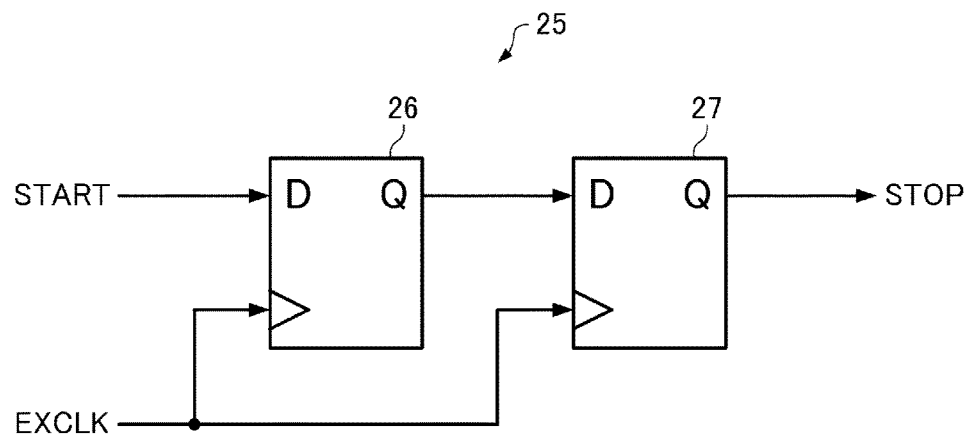
FIG. 8 is a diagram illustrating a configuration example of a measurement end signal generation circuit.

For example, as illustrated in FIG. 8, the measurement end signal generation circuit 25 may have a configuration in which a D-type flip-flop 26 and a D-type flip-flop 27 are coupled in series. In the D-type flip-flop 26, the measurement start signal START is input to a data input terminal D, and the measurement target clock signal EXCLK is input to a clock terminal. In the D-type flip-flop 27, a signal output from a data output terminal Q of the D-type flip-flop 26 is input to the data input terminal D, and the measurement target clock signal EXCLK is input to the clock terminal. A signal output from the data output terminal Q of the D-type flip-flop 27 becomes the measurement end signal STOP. In this manner, the measurement end signal generation circuit 25 is configured such that the D-type flip-flop 26 and the D-type flip-flop 27 are coupled in series, and thus since a metastable state of the signal outputted from the data output terminal Q of the D-type flip-flop 26 does not propagate to the measurement end signal STOP, malfunction of the frequency counter 20 can be prevented.

The second counter 22 counts the pulse number of the measurement target clock signal EXCLK and generates the second count data CNT2. Specifically, the second counter 22 ends the counting of the pulse number of the previous measurement target clock signal EXCLK at each rising edge of the measurement end signal STOP to initialize the second count data CNT2, and starts the counting of the pulse number of the measurement target clock signal EXCLK. The second counter 22 generates the second count data CNT2 indicating the count value of the pulse number of the measurement target clock signal EXCLK.

In the frequency counter 20 having such a configuration, the first counter 21 generates the first count data CNT1 at each rising edge of the measurement start signal START so that the count number $N_r$ defined by the gate time signal GT is obtained. Further, the second counter 22 generates the second count data CNT2 at each rising edge of the measurement end signal STOP. That is, the first counter 21 generates the first count data CNT1 a plurality of times, and the second counter 22 generates the second count data CNT2 a plurality of times.

Further, the time-to-digital conversion circuit 30 illustrated in FIG. 1 generates the first time difference data and the second time difference data a plurality of times. The calculation circuit 40 generates the frequency data FD1 a plurality of times based on the second count data CNT2 generated a plurality of times and the first time difference data and the second time difference data that are generated a plurality of times, and filters the frequency data FD1 generated a plurality of times to generate the frequency data FD2.

1-4. Configuration of Time-to-Digital Conversion Circuit

Figure 9:
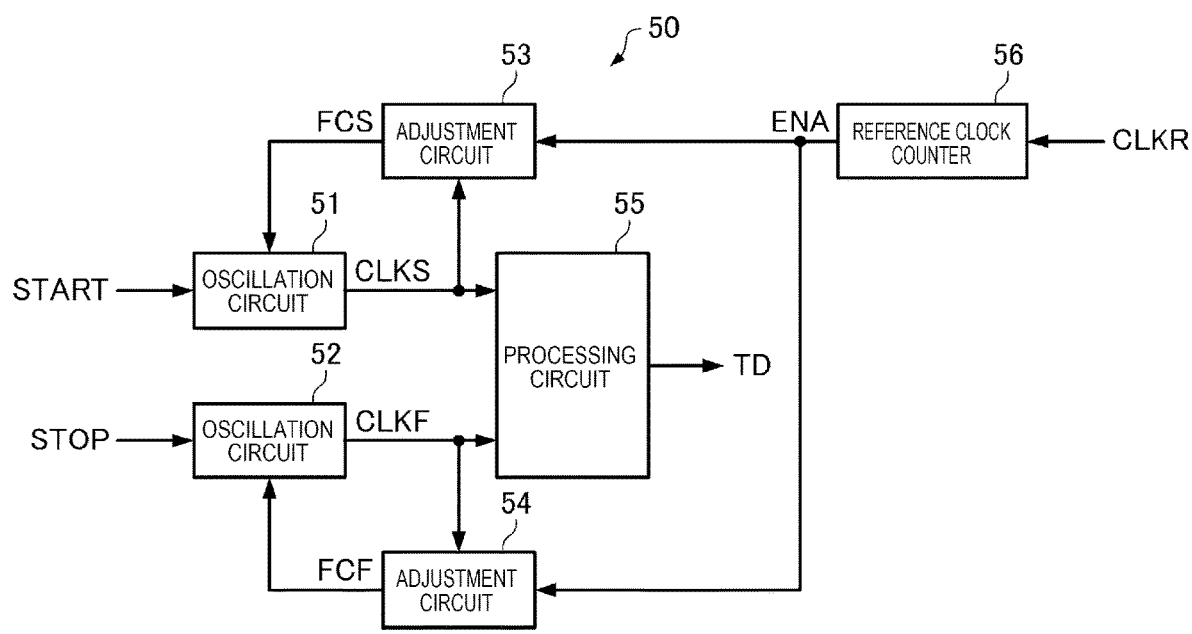
FIG. 9 is a diagram illustrating a configuration example of a time-to-digital conversion circuit.

FIG. 9 is a diagram illustrating a configuration example of the time-to-digital conversion circuit 30. The time-to-digital conversion circuit 30 illustrated in FIG. 9 includes an oscillation circuit 51, an oscillation circuit 52, an adjustment circuit 53, an adjustment circuit 54, a processing circuit 55, and a reference clock counter 56.

The oscillation circuit 51 starts oscillation at a rising edge of the measurement start signal START and generates a clock signal CLKS of a clock frequency $f_1$. The oscillation circuit 52 starts oscillation at a rising edge of the measurement end signal STOP and generates the clock signal CLKF having a clock frequency $f_2$ different from the clock frequency $f_1$.

The clock signal CLKS is an oscillation signal of the oscillation circuit 51 or a clock signal obtained by dividing the oscillation signal. Accordingly, the clock frequency $f_1$ is an oscillation frequency of the oscillation circuit 51 or a frequency of the divided clock signal. In a similar manner, the clock signal CLKF is an oscillation signal of the oscillation circuit 52 or a clock signal obtained by dividing the oscillation signal. Accordingly, the clock frequency $f_2$ is an oscillation frequency of the oscillation circuit 52 or a frequency of the divided clock signal. For example, the clock frequency $f_2$ is a higher frequency than the clock frequency $f_1$.

The oscillation circuit 51 is, for example, a ring oscillator that oscillates with the measurement start signal START as a trigger. That is, an oscillation loop of the ring oscillator is enabled at the rising edge of the measurement start signal START, and the oscillation of the ring oscillator is started. In a similar manner, the oscillation circuit 52 is, for example, a ring oscillator that oscillates with the measurement end signal STOP as a trigger. That is, an oscillation loop of the ring oscillator is enabled at the rising edge of the measurement end signal STOP, and the oscillation of the ring oscillator is started. The oscillation circuits 51 and 52 are not limited to ring oscillators.

The adjustment circuit 53 measures the clock frequency $f_1$ based on the reference clock signal CLKR, and adjusts an oscillation frequency of the oscillation circuit 51 so that the clock frequency $f_1$ becomes a target frequency $tgf_1$. The adjustment circuit 54 measures the clock frequency $f_2$ based on the reference clock signal CLKR, and adjusts an oscillation frequency of the oscillation circuit 52 so that the clock frequency $f_2$ becomes a target frequency $tgf_2$.

In the measurement of the clock frequencies $f_1$ and $f_2$, the clock frequencies $f_1$ and $f_2$ itself may be measured, or parameters corresponding to the clock frequencies $f_1$ and $f_2$ may be measured. Alternatively, periods that are reciprocals of the clock frequencies $f_1$ and $f_2$ or parameters corresponding to the periods may be measured. For example, in FIG. 9, the reference clock counter 56 counts the clock number of the reference clock signal CLKR, and outputs an enable signal ENA that becomes active during the period of counting the given clock number. The adjustment circuits 53 and 54 measure the clock frequencies $f_1$ and $f_2$ by counting the clock signals CLKS and CLKF during the period at which the enable signal ENA is active. In this case, the clock numbers of the clock signals CLKS and CLKF in a given period are the parameters corresponding to the clock frequencies $f_1$ and $f_2$.

The configuration for measuring the clock frequencies $f_1$ and $f_2$ based on the reference clock signal CLKR is not limited to FIG. 9. For example, the reference clock signal CLKR may be input to the adjustment circuits 53 and 54. In this case, for example, a counter corresponding to the reference clock counter 56 may be provided in each of the adjustment circuits 53 and 54.

The adjustment circuit 53 generates control data FCS based on the measured clock frequency $f_1$, performs the feedback control for the oscillation frequency of the oscillation circuit 51 by the control data FCS, and performs control so that the clock frequency $f_1$ becomes the target frequency $tgf_1$. For example, proportional-integral (PI) control or proportional-integral-differential (PID) control based on the difference $(f_1-tgf_1)$ is performed. The adjustment circuit 54 generates the control data FCS based on the measured clock frequency $f_2$, performs the feedback control for the oscillation frequency of the oscillation circuit 52 by the control data FCS, and performs control so that the clock frequency $f_2$ becomes the target frequency $tgf_2$. For example, the PI control or the PID control based on the difference ($f_2$–$tgf_2$) is performed. The target frequencies $tgf_1$ and $tgf_2$ are set in, for example, a register (not illustrated).

The oscillation circuits 51 and 52 oscillate at oscillation frequencies corresponding to signal values of the control data FCS and FCF, respectively. For example, when the oscillation circuits 51 and 52 are ring oscillators, the oscillation frequency is controlled by controlling the load of the oscillation loop and the drive capability of a drive circuit with the control data FCS and FCF.

The processing circuit 55 converts a time difference between the rising edge of the measurement start signal START and the rising edge of the measurement end signal STOP into a digital value based on the clock signal CLKS and the clock signal CLKF, and outputs the digital value as a time-to-digital value TD. Specifically, the first edge of the clock signal CLKS is generated at the rising edge of the measurement start signal START, and the first edge of the clock signal CLKF is generated at the rising edge of the measurement end signal STOP. The phase difference between the first edges of the clock signals CLKS and CLKF is the same as the time difference between the rising edge of the measurement start signal START and the rising edge of the measurement end signal STOP. Since the time difference between the edges of the clock signals CLKS and CLKF decreases by $\Delta t$, by counting the clock number until the front/rear of the edges of the clock signals CLKS and CLKF are switched, the time difference can be obtained by the count value×$\Delta t$.

The $\Delta t$ is a resolution of time measurement, and can be expressed by the following Equation 2.

$$\Delta t = \left| \frac{1}{f_1} - \frac{1}{f_2} \right| = \frac{|f_1 - f_2|}{f_1 \times f_2} \quad (2)$$

That is, the time-to-digital conversion circuit 30 converts time into a digital value with a resolution corresponding to a frequency difference between the clock frequencies $f_1$ and $f_2$. The clock frequencies $f_1$ and $f_2$ are selected to obtain a desired resolution $\Delta t$. That is, the target frequencies $tgf_1$ and $tgf_2$ are set so that the clock frequencies $f_1$ and $f_2$ can obtain the desired resolution $\Delta t$. For example, the targets frequencies $tgf_1$ and $tgf_2$ are set such that $N/tgf_1 = M/tgf_2$ where N and M are different integers of two or more.

Figure 10:
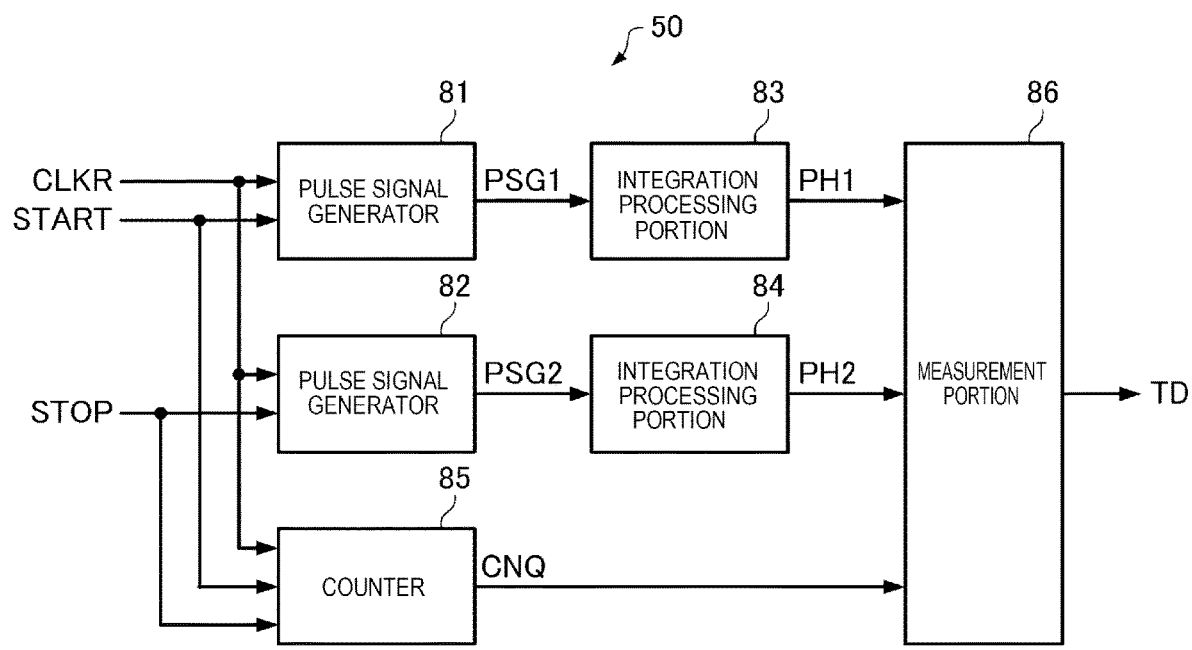
FIG. 10 is a diagram illustrating another configuration example of the time-to-digital conversion circuit.

FIG. 10 is a diagram illustrating another configuration example of the time-to-digital conversion circuit 30. The time-to-digital conversion circuit 30 illustrated in FIG. 10 includes a pulse signal generator 81, a pulse signal generator 82, an integration processing portion 83, an integration processing portion 84, a counter 85 and a measurement portion 86.

The pulse signal generator 81 generates a pulse signal PSG1 based on the reference clock signal CLKR and the measurement start signal START. The pulse signal generator 82 also generates a pulse signal PSG2 based on the reference clock signal CLKR and the measurement end signal STOP.

The integration processing portion 83 generates a phase difference signal PH1 corresponding to a phase difference between the rising edge of the reference clock signal CLKR and the rising edge of the measurement start signal START based on the pulse signal PSG1. Further, the integration processing portion 84 generates a phase difference signal PH2 corresponding to a phase difference between the rising edge of the reference clock signal CLKR and the rising edge of the measurement end signal STOP based on the pulse signal PSG2.

The counter 85 counts the clock number of the reference clock signal CLKR between the rising edge of the measurement start signal START and the rising edge of the measurement end signal STOP.

The measurement portion 86 measures the time difference between the rising edge of the measurement start signal START and the rising edge of the measurement end signal STOP based on a count value CNQ of the counter 85, the phase difference signal PH1 and the phase difference signal PH2, and outputs the digital value of the measurement result as the time-to-digital value TD.

1-5. Layout of Frequency Measurement Circuit

Figure 11:
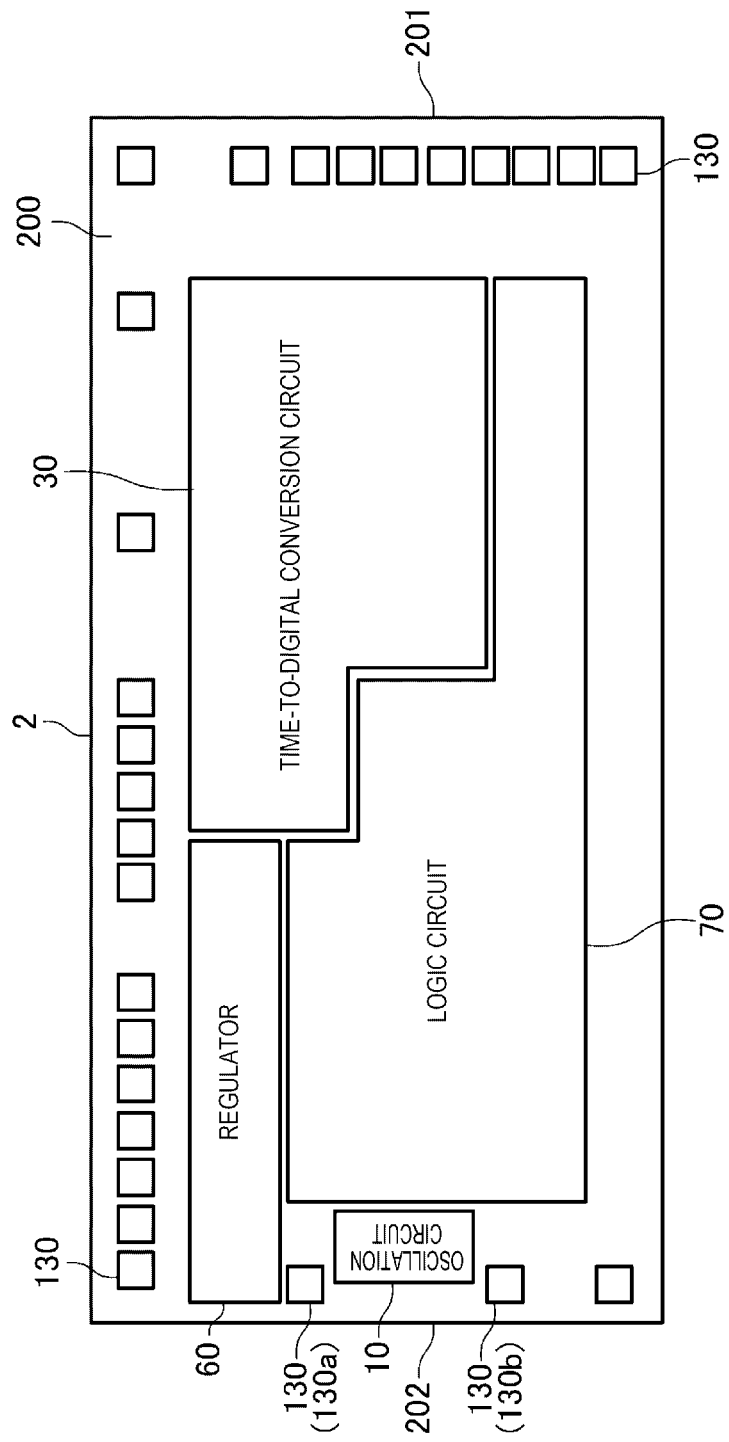
FIG. 11 is a diagram illustrating a layout of the frequency measurement circuit.

FIG. 11 is a diagram illustrating a layout of the frequency measurement circuit 2 in the present embodiment. As illustrated in FIG. 11, in the present embodiment, the frequency measurement circuit 2 is integrated into a semiconductor substrate 200. That is, the oscillation circuit 10, the time-to-digital conversion circuit 30, the regulator 60, the logic circuit 70, and the plurality of electrode pads 130 described above are provided on the semiconductor substrate 200. The plurality of electrode pads 130 are provided on a peripheral edge portion of the semiconductor substrate 200 to substantially surround the oscillation circuit 10, the time-to-digital conversion circuit 30, the regulator 60 and the logic circuit 70.

As illustrated in FIG. 11, in the present embodiment, in plan view of the frequency measurement circuit 2, that is, in plan view of the semiconductor substrate 200, the logic circuit 70 including the frequency counter 20, the calculation circuit 40, and the interface circuit 50 is disposed between the oscillation circuit 10 and the time-to-digital conversion circuit 30. Accordingly, the oscillation circuit 10 and the time-to-digital conversion circuit 30 are separated from each other, and it is possible to reduce the possibility that the conversion precision of the time-to-digital conversion circuit 30 is decreased due to the high frequency noise generated by the oscillation circuit 10.

Further, as illustrated in FIGS. 1 and 2, in the present embodiment, the resonator 3 does not overlap the frequency measurement circuit 2 in plan view of the frequency measurement apparatus 1. That is, the resonator 3 does not overlap with the time-to-digital conversion circuit 30 in plan view of the frequency measurement apparatus 1. Further, as illustrated in FIG. 11, since the time-to-digital conversion circuit 30 is positioned away from electrode pads 130a and 130b electrically coupled to the resonator 3, the resonator 3 does not overlap with the time-to-digital conversion circuit 30 in plan view of the frequency measurement apparatus 1 although the size of the resonator 3 is larger than that in FIGS. 1 and 2. Accordingly, it is possible to reduce the possibility that the conversion precision of the time-to-digital conversion circuit 30 is decreased due to the high frequency noise generated by the resonator 3.

Further, as illustrated in FIGS. 1, 2, and 11 in the present embodiment, in plan view of the frequency measurement apparatus 1, a distance between the resonator 3 and the oscillation circuit 10 is smaller than a distance between the resonator 3 and the time-to-digital conversion circuit 30. Accordingly, the parasitic capacitance and the parasitic resistance generated in the wiring coupling the resonator 3 and the oscillation circuit 10 are reduced, so that the reference clock signal CLKR output from the oscillation circuit can be stabilized and it is possible to reduce the possibility that the conversion precision of the time-todigital conversion circuit 30 is decreased due to the high frequency noise generated by the oscillation circuit 10.

Further, as illustrated in FIGS. 1, 2 and 11 in the present embodiment, in plan view of the frequency measurement apparatus 1, the semiconductor substrate 200 includes a first side 201 and a second side 202 that faces the first side 201 and that is closer to the resonator 3 than the first side 201, and the electrode pad 130a and the electrode pad 130b are disposed along the second side 202. Accordingly, the parasitic capacitance and parasitic resistance generated in the wiring coupling the resonator 3 and the oscillation circuit 10 are reduced, and the reference clock signal CLKR output from the oscillation circuit 10 can be stabilized. The electrode pad 130a is an example of the "first electrode pad", and the electrode pad 130b is an example of the "second electrode pad".

1-6. Working Effect

As described above, in the frequency measurement apparatus 1 of the present embodiment, the frequency measurement circuit 2 includes the oscillation circuit 10 that generates the reference clock signal CLKR, the first counter 21 that counts the pulse number of the reference clock signal CLKR and generates the first count data CNT1, and the second counter 22 that counts the pulse number of the measurement target clock signal EXCLK and generates the second count data CNT2. Further, the frequency measurement circuit 2 includes the time-to-digital conversion circuit 30 that generates the first time difference data indicating the time difference between the first timing at which the first counter 21 starts the counting of the pulse number of the reference clock signal CLKR and the second timing at which the second counter 22 starts the counting of the pulse number of the measurement target clock signal EXCLK, and the second time difference data indicating the time difference between the third timing at which the first counter 21 ends the counting of the pulse number of the reference clock signal CLKR and the fourth timing at which the second counter 22 ends counting of the pulse number of the measurement target clock signal EXCLK. Further, the frequency measurement circuit 2 includes the calculation circuit 40 that performs calculation based on the second count data CNT2, the first time difference data, and the second time difference data and generates the frequency data FD1 indicating the frequency of the measurement target clock signal EXCLK.

Since the period $T_0$ of the reference clock signal CLKR and the value $N_t$ of the gate time signal GT are known, the calculation circuit 40 can relatively easily calculate the frequency $F_m$ of the measurement target clock signal EXCLK and generate the frequency data FD1 by substituting the value $N_m$ of the second count data CNT2, the value $t_{p1}$ of the first time difference data, and the value $t_{p2}$ of the second time difference data into the Equation 1. From the Equation 1, the calculation precision of the frequency of the measurement target clock signal EXCLK depends on, when the value $N_t$ of the gate time signal GT is fixed, the precision of the value $t_{p1}$ of the first time difference data and the value $t_{p2}$ of the second time difference data, that is, the conversion precision of the time-to-digital conversion circuit 30, and does not depend on the period $T_m$ of the measurement target clock signal EXCLK. Accordingly, according to the frequency measurement apparatus 1 or the frequency measurement circuit 2 of the present embodiment, the frequency of the measurement target clock signal EXCLK can be measured with a constant precision regardless of the period of the measurement target clock signal EXCLK. Further, according to the frequency measurement apparatus 1 or the frequency measurement circuit 2 of the present embodiment, since the value of the gate time signal GT can be set optionally, the required frequency measurement precision can be achieved relatively easily.

Further, in the frequency measurement apparatus 1 of the present embodiment, the frequency measurement circuit 2 includes the measurement start signal generation circuit 24 that generates the measurement start signal START which defines the first timing and the third timing based on the reference clock signal CLKR, and the measurement end signal generation circuit 25 that generates the measurement end signal STOP which defines the second timing and the fourth timing based on the measurement target clock signal EXCLK, in which the time-to-digital conversion circuit 30 generates the first time difference data and the second time difference data based on the measurement start signal START and the measurement end signal STOP. Accordingly, according to the frequency measurement apparatus 1 or the frequency measurement circuit 2 of the present embodiment, the first counter 21 can count the pulse number of the reference clock signal CLKR between the first timing and the third timing based on the measurement start signal START to generate the first count data CNT1. Further, the second counter 22 can count the pulse number of the measurement target clock signal EXCLK between the second timing and the fourth timing based on the measurement end signal STOP to generate the second count data CNT2. Further, the time-to-digital conversion circuit 30 generates the first time difference data indicating the time difference between the first timing and the second timing based on the measurement start signal START and the measurement end signal STOP, and the second time difference data indicating the time difference between the third timing and the fourth timing based on the measurement start signal START and the measurement end signal STOP.

Further, in the frequency measurement apparatus 1 of the present embodiment, in the frequency measurement circuit 2, the first counter 21 generates the first count data CNT1 so that the count number $N_t$ defined by the gate time signal GT is reached. Accordingly, according to the frequency measurement apparatus 1 or the frequency measurement circuit 2 of the present embodiment, the required frequency measurement precision can be achieved relatively easily by setting the gate time signal GT.

Further, in the frequency measurement apparatus 1 of the present embodiment, in the frequency measurement circuit 2, the first counter 21 generates the first count data CNT1 a plurality of times, and the second counter 22 generates the second count data CNT2 a plurality of times. Further, the time-to-digital conversion circuit 30 generates the first time difference data and the second time difference data a plurality of times. The calculation circuit 40 generates the frequency data FD1 a plurality of times and filters the frequency data FD1 generated a plurality of times to generate the frequency data FD2. Accordingly, according to the frequency measurement apparatus 1 or the frequency measurement circuit 2 of the present embodiment, since the frequency data FD2 in which the noise superimposed on each frequency data FD1 is reduced can be obtained, the frequency measurement precision of the measurement target clock signal EXCLK can be improved.

In the frequency measurement apparatus 1 of the present embodiment, the logic circuit 70 including the calculation circuit 40 or the like is disposed between the oscillation circuit 10 and the time-to-digital conversion circuit 30 in the plan view of the frequency measurement circuit 2. Accordingly, according to the frequency measurement apparatus 1 or the frequency measurement circuit 2 of the present embodiment, since the oscillation circuit 10 is separated from the time-to-digital conversion circuit 30 by the logic circuit 70, it is possible to reduce the possibility that the conversion precision of the time-to-digital conversion circuit 30 is decreased by the high frequency noise generated by the oscillation circuit 10 so that the frequency measurement precision of the measurement target clock signal EXCLK is decreased.

Further, in the frequency measurement apparatus 1 of the present embodiment, the resonator 3 does not overlap with the time-to-digital conversion circuit 30 included in the frequency measurement circuit 2 in plan view of the frequency measurement apparatus 1. Accordingly, according to the frequency measurement apparatus 1 of the present embodiment, it is possible to reduce the possibility that the conversion precision of the time-to-digital conversion circuit 30 is decreased by the high frequency noise generated by the resonator 3 so that the frequency measurement precision of the measurement target clock signal EXCLK is decreased.

Further, in the frequency measurement apparatus 1 of the present embodiment, the distance between the resonator 3 and the oscillation circuit 10 is smaller than the distance between the resonator 3 and the time-to-digital conversion circuit 30. Accordingly, according to the frequency measurement apparatus 1 of the present embodiment, the parasitic capacitance and the parasitic resistance generated in the wiring coupling the resonator 3 and the oscillation circuit 10 are reduced, the reference clock signal CLKR is stabilized, and the possibility is reduced that the conversion precision of the time-to-digital conversion circuit 30 is decreased and the frequency measurement precision of the measurement target clock signal EXCLK is decreased by the high frequency noise generated by the oscillation circuit 10.

Further, in the frequency measurement apparatus 1 of the present embodiment, the electrode pad 130a and the electrode pad 130b are disposed along the second side 202 closer to the resonator 3 than the first side 201 of the semiconductor substrate 200. Accordingly, according to the frequency measurement apparatus 1 of the present embodiment, the parasitic capacitance and the parasitic resistance generated in the wiring coupling the resonator 3 and the oscillation circuit 10 are reduced, so that the reference clock signal CLKR is stabilized, and the possibility is reduced that the frequency measurement precision of the measurement target clock signal EXCLK is decreased.

2. Modification Example

In the embodiment described above, the first counter 21 counts the pulse number of the reference clock signal CLKR from the rising edge to the next rising edge of the measurement start signal START, but the pulse number of the reference clock signal CLKR from the falling edge to the next falling edge of the measurement start signal START may be counted.

Further, in the embodiment described above, the second counter 22 counts the pulse number of the measurement target clock signal EXCLK from the rising edge to the next rising edge of the measurement end signal STOP, but the pulse number of the measurement target clock signal EXCLK from the falling edge to the next falling edge of the measurement end signal STOP may be counted.

Further, in the embodiment described above, the enable signal EN, the trigger signal TRG, the measurement start signal START, and the measurement end signal STOP are all active at a high level, but may be active at a low level.

In the embodiment described above, the interface circuit 50 is an interface circuit compatible with the 3-wire SPI bus using the chip select signal CS, the serial clock signal SCK, and the serial input/output data signal SDIO, but the communication bus compatible with interface the circuit 50 is not limited to the 3-wire SPI bus. For example, the interface circuit 50 may be an interface circuit compatible with various communication buses such as a 4-wire SPI bus using the chip select signal CS, the serial clock signal SCK, the serial input data signal SDI, and the serial output data signal SDO and a 2-wire inter-integrated circuit (I2C) bus using the serial clock signal SCL and the serial input data signal SDA.

Further, in the embodiment described above, the resonator 3 is a quartz crystal resonator, but not limited to this, and may be a micro electro mechanical systems (MEMS) resonator, a bulk acoustic wave (BAW) resonator, a surface acoustic wave (SAW) resonator, or the like. As the substrate material of the resonator 3, besides the quartz crystal, a piezoelectric material such as a piezoelectric single crystal such as lithium tantalate and lithium niobate or a piezoelectric ceramic such as lead zirconate titanate, a silicon semiconductor material, or the like may be used. As an excitation unit of the resonator 3, one based on the piezoelectric effect may be used, or electrostatic drive by Coulomb force may be used.

The present disclosure is not limited to the present embodiment, and various modifications can be made within the scope of the gist of the present disclosure.

The embodiment and the modification example described above are examples, and the present disclosure is not limited to these. For example, each embodiment and each modification example can be appropriately combined.

The present disclosure includes a configuration substantially the same as the configuration described in the embodiment, for example, a configuration having the same function, method, and result, or a configuration having the same object and effect. Further, the present disclosure includes a configuration in which non-essential parts of the configuration described in the embodiment are replaced. Further, the present disclosure includes a configuration having the same working effect as the configuration or a configuration capable of achieving the same object, described in the embodiment. Further, the present disclosure includes a configuration in which known technology is added to the configuration described in the embodiment.

What is claimed is:

1. A frequency measurement circuit comprising:
an oscillation circuit that generates a reference clock signal;
a first counter that counts a pulse number of the reference clock signal and generates first count data;
a second counter that counts a pulse number of a measurement target clock signal and generates second count data;
a time-to-digital conversion circuit that generates first time difference data indicating a time difference between a first timing at which the first counter starts counting of the pulse number of the reference clock signal and a second timing at which the second counter starts counting of the pulse number of the measurement target clock signal, and second time difference data indicating a time difference between a third timing at which the first counter ends counting of the pulse number of the reference clock signal and a fourth timing at which the second counter ends counting of the pulse number of the measurement target clock signal; and a calculation circuit that performs calculation based on the second count data, the first time difference data, and the second time difference data and generates frequency data indicating a frequency of the measurement target clock signal.

2. The frequency measurement circuit according to claim 1, further comprising:
a measurement start signal generation circuit that generates a measurement start signal which defines the first timing and the third timing based on the reference clock signal; and
a measurement end signal generation circuit that generates a measurement end signal which defines the second timing and the fourth timing based on the measurement target clock signal, wherein
the time-to-digital conversion circuit
generates the first time difference data and the second time difference data based on the measurement start signal and the measurement end signal.

3. The frequency measurement circuit according to claim 1, wherein
the first counter generates the first count data so that a count number defined by a gate time signal is reached.

4. The frequency measurement circuit according to claim 3, wherein
the calculation circuit calculates Fm as Fm=Nm/(T$_0$×Nt+ t$_{p2}$−t$_{p1}$), in which
the frequency is Fm,
the count number is Nt,
a value of the second count data is Nm,
the time difference indicated by the first time difference data is t$_{p1}$,
the time difference indicated by the second time difference data is t$_{p2}$, and
one period of the reference clock signal is T$_0$.

5. The frequency measurement circuit according to claim 1, wherein
the first counter generates the first count data a plurality of times,
the second counter generates the second count data a plurality of times,
the time-to-digital conversion circuit generates the first time difference data and the second time difference data a plurality of times, and
the calculation circuit generates the frequency data a plurality of times and filters the frequency data generated a plurality of times.

6. The frequency measurement circuit according to claim 1, wherein
the calculation circuit is disposed between the oscillation circuit and the time-to-digital conversion circuit in plan view of the frequency measurement circuit.

7. A frequency measurement apparatus comprising:
the frequency measurement circuit according to claim 1;
a resonator; and
a package accommodating the frequency measurement circuit and the resonator, wherein
the oscillation circuit oscillates the resonator to generate the reference clock signal.

8. The frequency measurement apparatus according to claim 7, wherein
the resonator does not overlap with the time-to-digital conversion circuit included in the frequency measurement circuit in plan view of the frequency measurement apparatus.

9. The frequency measurement apparatus according to claim 7, wherein
a distance between the resonator and the oscillation circuit is smaller than a distance between the resonator and the time-to-digital conversion circuit in plan view of the frequency measurement apparatus.

10. The frequency measurement apparatus according to claim 7, wherein
the frequency measurement circuit is integrated into a semiconductor substrate,
the semiconductor substrate is provided with a first electrode pad and a second electrode pad that are electrically coupled to the resonator,
in plan view of the frequency measurement apparatus,
the semiconductor substrate has a first side and a second side that faces the first side and that is closer to the resonator than the first side, and
the first electrode pad and the second electrode pad are disposed along the second side.

* * * * *